United States Patent
Legros

[11] Patent Number: 5,319,237
[45] Date of Patent: Jun. 7, 1994

[54] POWER SEMICONDUCTOR COMPONENT

[75] Inventor: Patrick Legros, Paris, France

[73] Assignee: Thomson Composants Microondes, Puteaux, France

[21] Appl. No.: 127,456

[22] Filed: Sep. 27, 1993

Related U.S. Application Data

[63] Continuation of Ser. No. 902,492, Jun. 23, 1992, abandoned, which is a continuation of Ser. No. 665,671, Mar. 7, 1991, abandoned.

[30] Foreign Application Priority Data

Mar. 9, 1990 [FR] France .................. 90 03036

[51] Int. Cl.$^5$ .................. H01L 23/48; H01L 21/44
[52] U.S. Cl. .................. 257/522; 257/712; 257/726; 257/778; 257/796; 257/902; 437/182; 437/187; 437/209; 437/228
[58] Field of Search .................. 357/81; 257/522, 712, 257/776, 778, 796, 902; 437/182, 187, 209, 228

[56] References Cited

U.S. PATENT DOCUMENTS

| | | | |
|---|---|---|---|
| 3,675,089 | 7/1972 | Hantusch et al. | 357/80 |
| 4,751,562 | 6/1988 | Yamamura | 357/80 |
| 4,933,743 | 6/1990 | Thomas et al. | 257/776 |
| 5,018,004 | 5/1991 | Okinaga et al. | 351/81 |
| 5,053,855 | 10/1991 | Michii et al. | 257/675 |

FOREIGN PATENT DOCUMENTS

| | | |
|---|---|---|
| 0166633 | 1/1986 | European Pat. Off. . |
| 0334747 | 9/1989 | European Pat. Off. . |
| 2554275 | 5/1985 | France . |

OTHER PUBLICATIONS

Tokunou-JP-A-56-80164, Jul. 1, 1981, vol. 5, No. 145.
Patent Abstracts of Japan, vol. 12, No. 403 (E-674) (3250), Oct. 26, 1988, & JP-A-63-144 588, Jun. 16, 1988, Y. Nakajima, "Sub-Mount For Semiconductor Chip Laser".
Patent Abstracts of Japan, vol. 5, No. 145 (E-74) (817), Sep. 12, 1981.
IBM Technical Disclosure Bulletin, vol. 21, No. 11, Apr. 1979, E. Berndlmaier, "Dummy Pads For Reduced Thermal Resistance".

*Primary Examiner*—Edward W. Wojciechowicz
*Attorney, Agent, or Firm*—Oblon, Spivak, McClelland, Maier & Neustadt

[57] ABSTRACT

A self-encapsulated power conductor component with improved heat transfer has a chip bearing at least one power transistor having at least one interdigitated electrode, provided with an air bridge, and a sink provided with at least one metal islet in relief. The air bridge is reinforced and the chip is brazed in reverse to the islet of the sink by its air bridge. Other islets brazed to the metallizations on the rim of the chip reinforce the mechanical fixing. The access to the electrodes is obtained by via holes and the second face of the substrate may receive non-integrable components. The device can be applied to power transistors and integrated circuits, notably on GaAs.

23 Claims, 2 Drawing Sheets

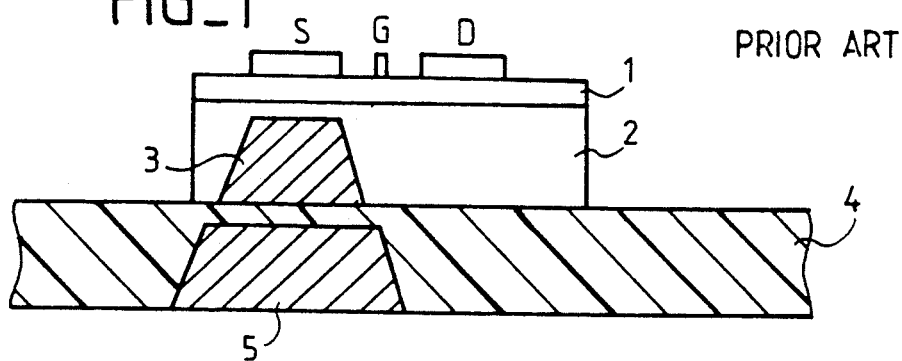
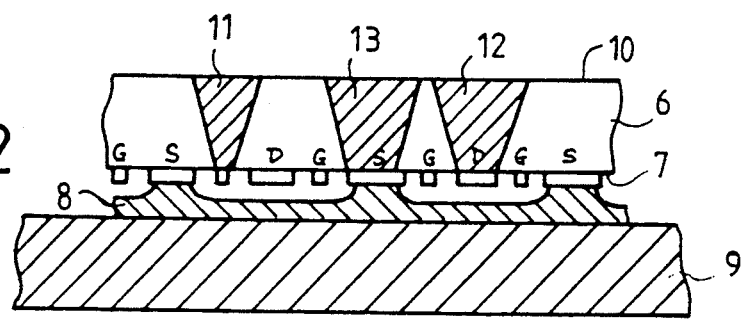
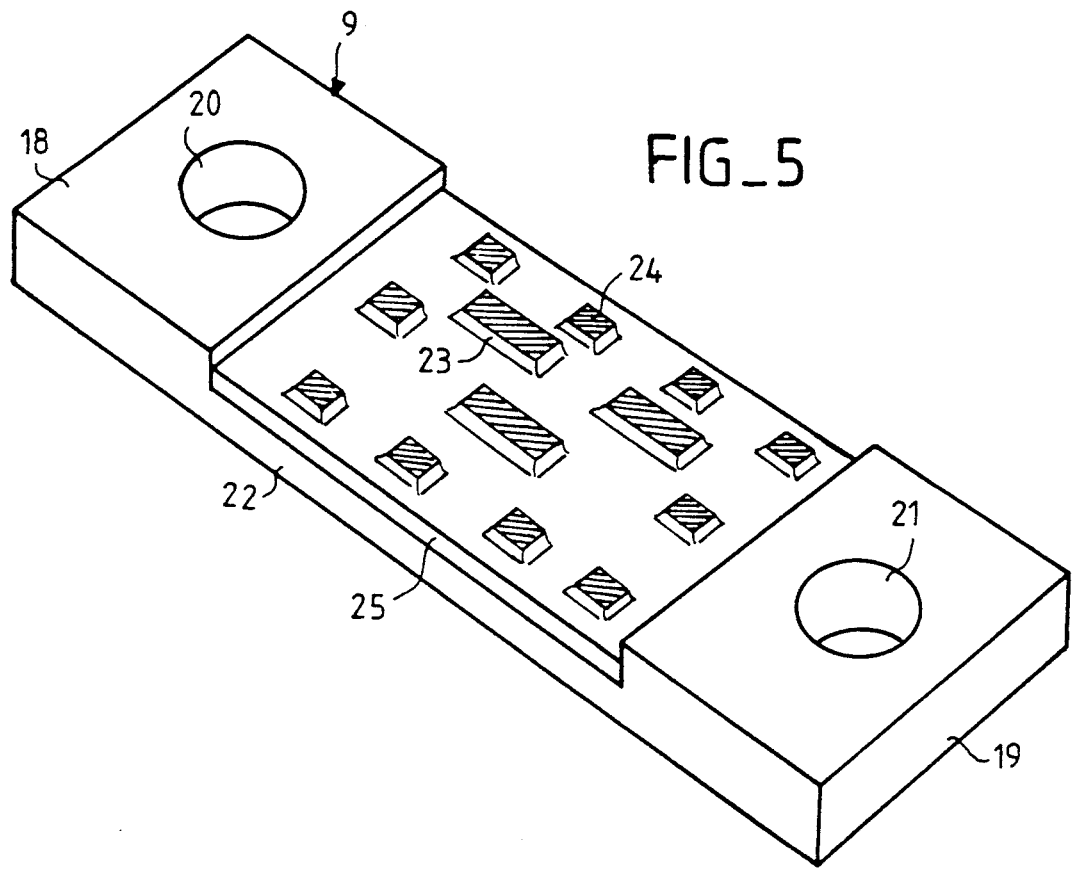

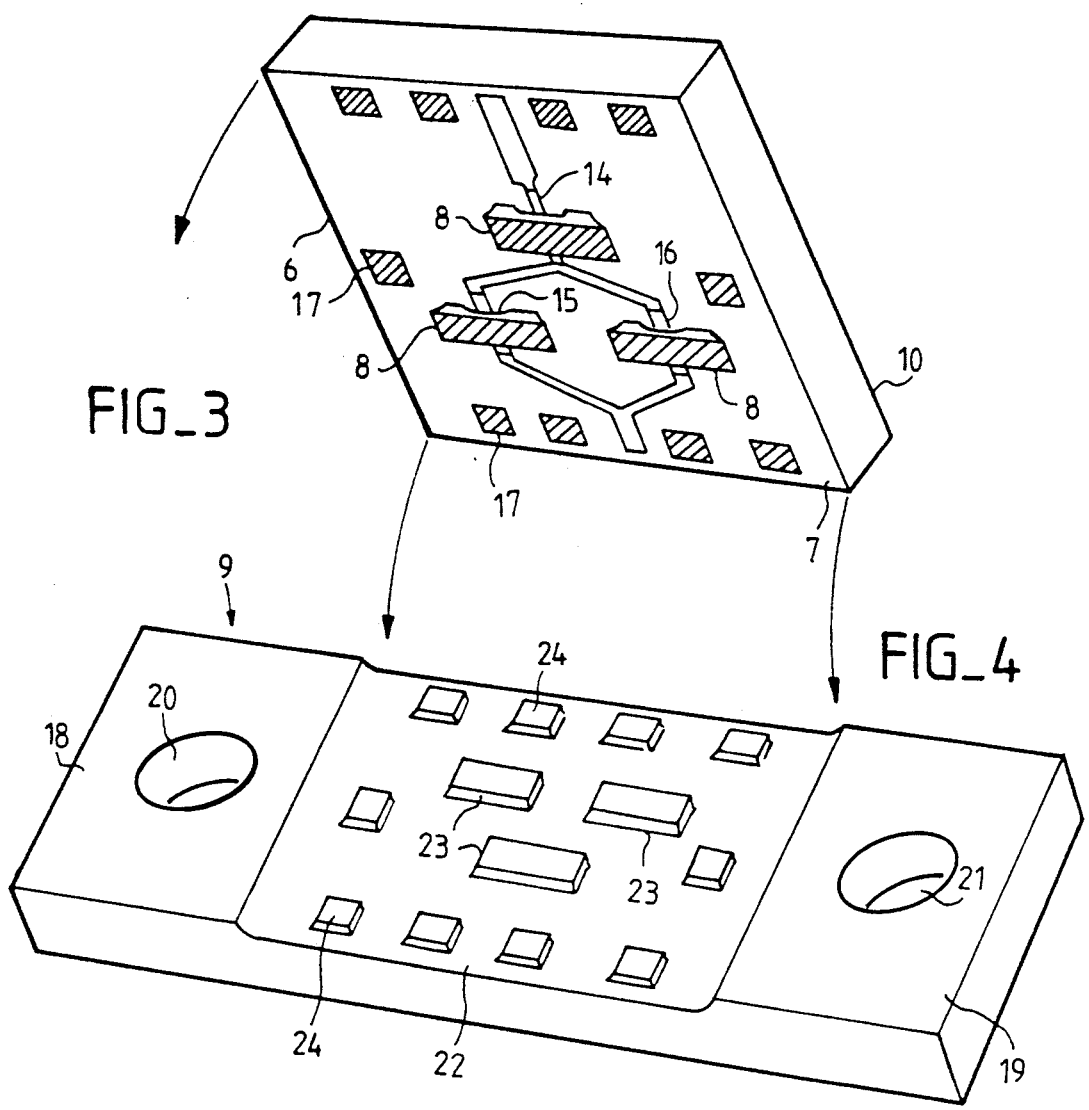
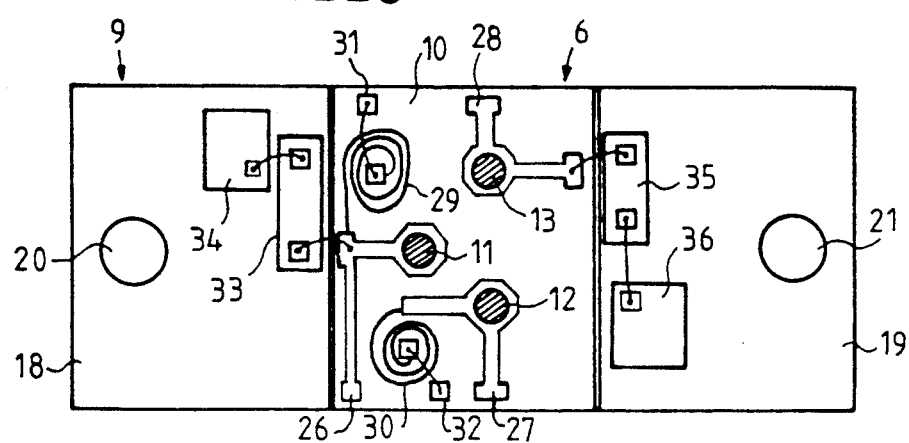

POWER SEMICONDUCTOR COMPONENT

This application is a continuation of application Ser. No. 07/902,492, filed on Jun. 23, 1992, now abandoned, which is a continuation of Ser. No. 07/665,671 filed On Mar. 7, 1991, also abandoned.

BACKGROUND OF THE INVENTION

1. Field of the Invention

The present invention relates to a semiconductor device including at least one interdigitated transistor, the chip of which is mounted on the reverse side, i.e. by its active face, to a base used as a heat sink. The mounting can be done in such a way that the chip is self-encapsulated.

2. Description of the Prior Art

It is known that, in a semiconductor device, the active part is on a first face of a chip and that it has a thickness of the order of 1 to 10 micrometers while the substrate has a thickness of the order of 300 to 500 micrometers. However, during operation, heat is produced by the active part and has to cross the entire substrate to be discharged by the second face of the substrate, by means of a heat sink.

The problem exists for semiconductors on silicon substrates which, however, have fairly good qualities of heat conduction capacity, but it is aggravated for semiconductors on substrates made of III-V materials such as GaAs, which is a very poor conductor of heat, and it becomes a very irksome problem in the case of power semiconductors which dissipate a lot of heat.

The currently used approaches are difficult and costly to implement. Among many possibilities, we might cite:

- the thinning of the substrate, by its rear face, to reduce the length of the heat transfer. However, this method embrittles the chip, especially if the circuit is a large-sized one;
- the implanting of a heat drain in the substrate, as shown in FIG. 1. If we consider a semiconductor reduced to an active layer 1 supported by a substrate 2, it is possible to etch a cavity in the substrate 2, up to the vicinity of the hottest region of the active layer 1, and to fill this cavity with a metal, which makes it a heat drain 3, in contact with a sink 4. But this technique is a delicate one.
- if the base 4 is itself a heat insulator, for example an alumina wafer in a hybrid circuit, it can be converted, in a manner similar to that described above, by being overlaid with metal regions 5 which improve the heat transfer coefficient, as shown in FIG. 1.

A further disadvantage of the different approaches is that they have a sequence of junctions between materials that are poor conductors of heat and materials that are good conductors of heat. This does not make for an optimum arrangement.

The invention proposes to dissipate the heat released during operation by means of a direct contact between the active layer of the semiconductor device and a heat sink, by brazing the chip "backwards" or in reverse to the sink.

However, in order to avoid short-circuiting the metallizations of the different electrodes of the semiconductor device, for example the source, gate and drain of a field-effect transistor, the electrodes of a same type, for example the source, which are at a same potential, are connected to one another by metal bridges, called "air" bridges, reinforced by an extra thickness in order to give them sufficient mechanical resistance. The invention can therefore be applied to an electronic circuit that includes at least one power transistor, which is itself interdigitated, including at least two fingers of a same electrode to enable a metal bridge to be set up between them.

SUMMARY OF THE INVENTION

More specifically, the invention relates to a power semiconductor component formed by a semiconductor chip and a heat sink, the semiconductor device borne by a first face of the chip including at least one interdigitated electrode metallization with at least two fingers, wherein, in order to transfer the heat released during operation towards the sink, the chip is brazed to the sink by means of at least one metal bridge, known as an "air bridge", that interconnects the fingers of an interdigitated electrode, the air bridge acting as a heat drain.

BRIEF DESCRIPTION OF THE DRAWINGS

The invention will be understood more clearly and its advantages will emerge more clearly from the following detailed description based on the appended figures, of which:

FIG. 1 shows a sectional view of a transistor mounted according to the prior art, explained here above;

FIG. 2 shows a sectional view of a transistor mounted on a sink according to the invention;

FIG. 3 shows a ¾ view in perspective of the chip of a semiconductor circuit, modified according to the invention;

FIG. 4 shows a ¾ view in perspective of the metal base, which is the sink of the chip of the above figure, according to the invention;

FIG. 5 shows a ¾ view in perspective of the base according to the invention in an alternative embodiment;

FIG. 6 shows a plane view of a circuit according to the invention including ancillary components.

DETAILED DESCRIPTION OF THE INVENTION

FIG. 2 shows the section of a fragment of a semiconductor device mounted on a sink according to the invention. In order to simplify the figure, only one part of the power transistor is shown, but it is clear that the invention can also be applied to the case of an integrated circuit including several transistors, or to bipolar transistors.

Let us consider the most unfavorable case from the thermal viewpoint: that of a microwave transistor made of GaAs or group III-V materials. Its chip is therefore made of GaAs and, on a first face 7, it has a series of metallizations that correspond to the electrodes of the different regions (not shown), namely the source, gate and drain regions (or emitter, base and collector regions in the case of a bipolar transistor).

To obtain sufficient power, the microwave power transistors are practically all formed by a plurality of parallel-connected low-power transistors. Their association may take different geometrical shapes, the most common on being the interdigitated shape according to which the source, gate and drain metallizations of one and the same transistor form a comb of parallel meta bands.

All the metallizations of a first type (for example the gate) are connected together by a bus, located on a first side of the comb, and all the metallizations of a second type (for example the drain) are connected together by another bus located on a second side of the comb. To join the metallizations of a third type (in this case the source) together, a third dimension has to be used (since there are only two dimensions in a plane). This third dimension is that of the air bridges, so named because they are metal bridges that leave an air space between themselves and the semiconductor chip.

According to the invention, these air bridges 8 are recharged with metal by electrolysis, until a thickness of about three micrometers is achieved for the bridge spans and a thickness of about four micrometers is achieved for the bridge piers. This thickness is sufficient to ensure efficient thermal conductivity and remove the heat released by the source of the transistor towards a sink.

When the chip of the semiconductor device has been thus modified by the thickening of the air bridges, it is brazed or soldered to a sink 9, no longer by the second face 10 (substrate face) of the chip as in the prior art but by its air bridges 8. The heat released at the first face 7, during operation, goes directly from the hot regions to the sink 9: the thermal path is very short, and the only interface between the hot and cold regions is a metal bridge, with high heat conduction capacity since the air bridges are generally made of gold.

Since the chip is mounted in reverse on a sink 9, the access is obtained by metallized holes or "via holes" through the substrate of the chip. At least one via hole 11 on the gate bus and at least one via hole 12 on the drain bus bring the gate and drain contacts to the second face 10, which is accessible, of the chip 6.

The electrical contact of the source may be made at the sink 9 if it is metallic, but it is preferable also to provide for a via hole 13 for the source. This enables the completed device to be tested with probe tips. Thus, in an apparatus for testing by probe tips, the probe tips all work in one and the same plane.

The mounting of a chip 6 on a sink 9 further calls for the making of contact means that can be seen more clearly in FIGS. 3 and 4.

FIGS. 3 and 4 should be considered simultaneously. FIG. 3 shows a ¾ underneath view of the semiconductor chip which has to be brazed to the sink 9 of FIG. 4, seen in a ¾ top view.

FIG. 3 shows an integrated circuit that is simplified to the utmost: whatever is not indispensable to understanding the description is not shown. The diagram shows that it is, for example, an amplifier with a tree structure having an input stage constituted by a power transistor 14 and an output stage constituted by two power transistors 15 and 16 in parallel.

These three power transistors are interdigitated and provided, at their sources for example (since it is the sources that release the greatest amount of heat in a field effect transistor), with air bridges 8. These air bridges have maximum dimensions in view of the surface geometry of the circuit, so as to lower the heat impedance.

In order to avoid the brazing of the semiconductor chip 6 to the sink 9 solely by the air bridges 8, which are too brittle, it is provided that a plurality of metallized pads 17 will be positioned on the rim of the chip, on its face 7: it is these metallized pads that support the mechanical stress in the brazed chip/sink association, while the air bridges 8 are used only for heat transfer.

The sink 9 may have different configurations and can be made of different materials with high heat conduction capacity. It maybe metallic and may have a shape that is homothetic with that of the semiconductor chip 6, but it advantageously has a shape such as the one shown in FIG. 4.

It is a metal rectangle, for example made of gold-plated, nickel-plated or tin-plated copper, thick enough to have a high calorific absorption capacity. Each of its two opposite ends 18 and 19 has a hole 20 and 21 respectively and thus forms a lug for the fixing of the completed device. The central part 22 is slightly recessed with respect to a main face of the sink. It has two series of islets in relief. The islets 23 of the first series have a height and position that are well determined so that they correspond to the air bridges 8 of the chip 6. The islets 24 have a position in relation to the metallized pads 17 of the chip 6 and a slightly greater height than that of the islets 23, in order to prevent the air bridges 8 from being crushed when the chip 6 is brazed to the sink 9. The height of an islet 24 is equal to the sum of the heights of an islet 23 and an air bridge 8.

The islets 23 and 24 can be made either by the stamping of the metal plate or by chemical etching, with adequate masking. When the islets are made, they receive a layer of brazing on their upper face, either by evaporation or by electrolysis: both these techniques require adequate masking.

It is enough to deposit the chip 6 in reverse on its sink 9, with the parts to be brazed together being perfectly face to face, and to heat the entire unit, for the air bridges 8 and the pads 17 to be brazed to the sink 9. In this example of a metal sink, all the air bridges 8 are at the same potential, generally the ground.

However, it may happen that, in the integrated circuit, several hot regions may be at different potentials: for example the source of a first transistor may be at the ground and the source of a second transistor may be at a different voltage. A single metal sink, such as the one shown in FIG. 4, would short-circuit these potentials and therefore cannot be used.

In this case, the solution is provided by an electrical insulating sink shown in FIG. 5. It has a metal base, provided with fixing lugs 18/20 and 19/21 comparable to that of the previous figure, but its central part 22 is more deeply machined to enable the insertion therein of an insulator wafer 25 brazed by its rear face to the base. This wafer 25 may be made of beryllium oxide, aluminium nitride or industrial diamond. These are electrical insulators well known for their high heat conduction capacity.

As above, the islets 23 and 24 have positions and heights fixed by the geometry of the semiconductor chip brazed thereto. They may be obtained by etching, but this process is lengthy and costly with the materials cited. It is preferably to obtain them by electrolytic growth, through metallic imprints deposited by evaporation on the insulator wafer 25. The islets 23 and 24 may be constituted either by a first metal layer on which a brazing layer is deposited or, given the thicknesses involved, by a single brazing layer.

In a first improvement of the invention, the number of metallized pads 17 and islets 24 is increased until they form, respectively, a seam that follows the rim of the chip 6 and a wall that follows the contour of the central part 22 of the sink. When the chip 6 is brazed to its sink 9, its active face 7 is self-encapsulated, and the substrate of the chip acts as a lid for this micro-package. The mechanical holding means 17 and 24 have, moreover, become the flanks of the micro-package.

A second improvement is shown in FIG. 6, which shows a plane view of a semiconductor chip mounted on a sink according to the technique of the invention.

Since the semiconductor chip 6 is mounted in reverse to its sink 6 which acts as a base for it, the rear face 10 of the chip is freely accessible and has via holes 11, 12, 13 by which access is obtained to the electrodes of the device, namely the transistor or integrated circuit. The second improvement proposed ma include several steps.

In the first step, each via hole is joined to an external connection pad located on the edge of the rear face 10 of the chip. In the example shown, the via holes 11, 12, 13 are joined, respectively, to the pads 26, 27, 28. To make it possible for several devices according to the invention to be cascade-connected, the external access pads are advantageously positioned along the two edges of the chip that are not facing a fixing lug 18 and 19.

In the second step, non-integrable components are deposited directly on the face 10 of the chip, provided only that the chip has a sufficient area to allow this. For example, two inductors 29 and 30 are connected to the via holes 11 and 12 in FIG. 6. The components attached to the chip may either form a circuit or be connected to external connection pads such as 31 and 32.

Finally the invention provides for the mounting of non-integrable components outside the chip 6, on the sink 9 which is used as a base. To this end, the fixing lugs 18 and 19 may, if necessary, be modified or enlarged and components, preferably block-shaped, are brazed to the fixing lugs 18 and 19 against the edges of the chip 6. For example, in FIG. 6, the components 33+34 and 35+36 are two RC filtering networks.

A device provided with these improvements therefore takes the form of a micro-package with a metal base, wherein the semiconductor is self-encapsulated by its substrate, this micro-package bearing an electronic circuit and external connection means on its external face (formed by the face 10 of the substrate). The circuit external to the package is advantageously protected by a resin or a lid.

The invention is preferably applied to microwave devices: the circuits mounted according to the invention have better performance characteristics than those mounted according to standard techniques, by hybridation.

What is claimed is:

1. A power semiconductor component, comprising:
   a heat sink;
   a semiconductor chip;
   a semiconductor device borne by a first face of said chip having at least one interdigitated electrode metallization with at least two fingers; and
   a metal air bridge formed on and electrically connecting said at least two fingers;
   wherein said chip is joined to said heat sink using said air bridge and said air bridge acts as a heat drain;
   wherein said metal air bridge is lithographically and electrolytically formed on said semiconductor chip, said metal air bridge comprising one span and a two piers, wherein a thickness of the one span is less than 20 microns and a thickness of the two piers is less than 20 microns.

2. A power component according to claim 1, wherein the air bridge is reinforced by an extra thickness of metal.

3. A power component according to claim 1, wherein mechanical fixing of the chip to the sink is further achieved by a plurality of metallizations placed on the rim of the chip and brazed to the sink.

4. A power component according to claim 1, wherein the sink bears, in its central part, a plurality of metal islets in relief, at least one of which faces at least one air bridge of the semiconductor chip, the other metal islets facing the metallizations positioned on a rim of the chip which is brazed to the heat sink by means of the islets.

5. A power component according to claim 4, wherein the metal islets are etched or stamped in a metal sink.

6. A power component according to claim 4, wherein the metal islets are mounted on a wafer that is made of an electric insulator material but is a heat conductor, such as BeO, Al, N or diamond, this wafer being brazed to the central part of the metal sink.

7. A power component according to claim 4, wherein the sink has two lateral fastening lugs that make it the base of the semiconductor device.

8. A power component according to claim 4, wherein a continuous metallization on the rim of the chip and a single islet on the rim of the central part of the sink constitute, after brazing, an encapsulating micro-package of the semiconductor device.

9. A power component according to claim 1 wherein, the chip being mounted in reverse on its sink, via holes through the substrate of the chip provide access to the electrodes of the device and open out on the second face of the chip.

10. A power component according to claim 9, wherein an interconnection circuit, external wiring pads and non-integrable components are deposited on the second face of the substrate o the chip.

11. A power component according to claim 10, wherein passive components in the form of blocks are deposited on the sink, in the vicinity of the edges of the chip.

12. A power semiconductor component according to claim 4, wherein said other metal islets have a height greater than that of said at least one metal islet facing said air bridge, said other metal islet mechanically supporting said chip.

13. A power semiconductor component according to claim 1, wherein said air bridge comprises:
   a single metal member having a first surface connected to said heat sink and at least two second surfaces respectively connected to said at least two fingers.

14. A power semiconductor component according to claim 13, wherein said second faces contact only said fingers.

15. A power semiconductor component according to claim 13, wherein said single metal member is comprises of gold.

16. A power semiconductor component, comprising:
   a semiconductor chip having a first surface;
   a heat sink having a first surface, wherein the heat sink is thick enough to have a high caloric absorption capacity;
   wherein the semiconductor chip includes a semiconductor device fabricated int he first surface of the semiconductor chip, an interdigitated electrode metallization having at least two fingers being disposed upon the first surface of the semiconductor chip;
   a metal air bridge formed on an electrically connecting said at least two fingers, wherein said air bridge comprises two piers and one span, a thickness of each of the two piers and the one span are less than 20 microns, the one span has upper and lower surfaces, the lower surface of the one span opposes a conducting region of the semiconductor device on the first surface of the semiconductor chip and the upper surface of the one span is electrically and thermally connected to the first surface of the heat sing.

17. A device according to claim 16, wherein a thickness of the one span is about 3 microns and a thickness of each of the two piers are each about 4 microns, and the one span and the two piers comprise electrolytically deposited gold.

18. A power semiconductor component, comprising:
a heat sink that is thick enough to have a high caloric absorption capacity and has a first surface;
a semiconductor chip having a planar semiconductor device in a first surface of the semiconductor chip, an interdigitated electrode metallization with at least two fingers being disposed on the first surface of the semiconductor chip;
a metal air bridge comprising two piers and one span, the piers contacting the fingers of the electrode metallization;
wherein the first surface of the heat sink has at least one first eyelet projecting a first height above the first surface of the heat sink, said first eyelet for electrically and thermally connecting to the one span of the metal air bridge, the first surface of the heat sink also having a second eyelet projecting a second height above the first surface of the heat sink, the second height of the second eyelet being slightly greater than the first height of the first eyelet so that the second eyelet can structurally support the semiconductor chip, wherein the first surface of the semiconductor chip opposes the first surface of the heat sink and the second eyelet contacts and is connected to the semiconductor chip and the first eyelet is electrically and thermally connected to an upper surface of the one span of the metal air bridge.

19. A semiconductor component, comprising:
a heat sink having a first surface, the heat sink being thick enough to have a high thermal caloric absorption
a semiconductor chip having a first surface, wherein the first surface of the heat sink opposes the first surface of the semiconductor chip;
a semiconductor device in the first surface of the semiconductor chip and at least one interdigitated electrode metallization having at least two fingers on the first surface of the semiconductor chip;
a metal air bridge formed on the semiconductor chip, said metal air bridge comprising two piers and one span, the piers each having a lower end electrically connected to a different one of the fingers and an upper end supporting and electrically connected to a lower surface of the one span, the one span of the metal air bridge is supported by the two piers so that the lower surface of the one span is spaced from the first surface of the semiconductor chip, the upper surface of the one span is electrically and thermally joined to the first surface of the heat sink; and wherein via holes are formed from the first surface of the semiconductor chip to a second surface of the semiconductor chip; and further comprising planar electrical components fabricated on the second surface of the semiconductor chip, said planar electrical components are electrically connected to the semiconductor device by means of the via holes.

20. A method of fabricating a power semiconductor component, comprising the steps of:
forming a semiconductor device in a first surface of a semiconductor chip;
disposing an interdigitated electrode metallization having at least two fingers on the first surface of the semiconductor chip;
lithographically and electrolytically forming a metal air bridge having at least one span and two piers on the first surface of the semiconductor chip, wherein a thickness of the two piers is less than 20 microns and a thickness of the one span is less than 20 microns, wherein a lower surface of the one span opposes and is spaced from a conducting region on the surface of the semiconductor chip; and
electrically and thermally connecting an upper surface of the one span to a first surface of a heat sink, wherein the heat sink is thick enough to have a high caloric absorption capacity.

21. A method according to claim 20, wherein the first surface of the heat sink is at least as large as the first surface of the semiconductor chip.

22. A method according to claim 20, further comprising the steps of:
forming a first eyelet on the first surface of the heat sink; and
forming a second eyelet on the first surface of the heat sink; and
forming a second eyelet on the first surface of the heat sink, wherein the step of connecting the heat sink to the semiconductor chip comprises electrically and thermally connecting the first eyelet to the upper surface of the one span and structurally connecting the second eyelet to the semiconductor chip, so that the second eyelet structurally supports the semiconductor chip, thereby preventing the air bridge from being crushed.

23. A method according to claim 22, wherein the second eyelet projects a greater distance form the first surface of the heat sink than does the first eyelet.

* * * * *